United States Patent [19]
Jang et al.

[11] Patent Number: 5,841,294
[45] Date of Patent: Nov. 24, 1998

[54] METHOD FOR MEASURING LEAKAGE CURRENT IN JUNCTION REGION OF SEMICONDUCTOR DEVICE

[75] Inventors: Se Aug Jang; Tae Sik Song, both of Kyoungki-do, Rep. of Korea

[73] Assignee: Hyundai Electronics Industries Co., Ltd., Ichon-shi, Rep. of Korea

[21] Appl. No.: 672,927

[22] Filed: Jun. 28, 1996

[30] Foreign Application Priority Data

Jun. 30, 1995 [KR] Rep. of Korea .................. 1995-18861

[51] Int. Cl.⁶ ................................................. G01R 31/26
[52] U.S. Cl. ............................................................ 324/765
[58] Field of Search ................................ 324/765, 158.1, 324/716, 717, 767–769, 73.1, 719; 257/40, 48; 438/14, 17, 18; 29/574

[56] References Cited

U.S. PATENT DOCUMENTS

| | | | |
|---|---|---|---|
| 4,144,493 | 3/1979 | Lee et al. ................................... | 29/574 |
| 4,978,915 | 12/1990 | Andrews, Jr. et al. ................. | 324/73.1 |
| 5,063,422 | 11/1991 | Hillenius et al. . | |
| 5,210,045 | 5/1993 | Possin et al. . | |
| 5,239,270 | 8/1993 | Desbiens ................................. | 324/767 |
| 5,334,540 | 8/1994 | Ishii ....................................... | 324/767 |
| 5,625,300 | 4/1997 | Sachdev ................................. | 324/769 |

Primary Examiner—Vinh P. Nguyen
Attorney, Agent, or Firm—Thelen Reid & Priest LLP

[57] ABSTRACT

A simple and accurate measurement of leakage current in the junction region of a semiconductor device involves a simple processing step carried out after element-isolating oxide films are formed. A method of measuring the junction leakage current involves providing a first-conduction-type silicon substrate, forming a first-conduction-type well in the substrate, forming element-isolating oxide films on the substrate, implanting second-conduction-type impurity ions in the substrate to form impurity diffusion regions, forming a conductive layer for an electrode over a resulting structure. Then, the method involves patterning the conductive layer to define plural dies that each have plural cells that each include the impurity diffusion regions and the conductive layer. Finally, reverse voltage is applied to the impurity diffusion regions and the substrate so as to measure the junction leakage current.

16 Claims, 9 Drawing Sheets

METHOD FOR MEASURING LEAKAGE CURRENT IN JUNCTION REGION OF SEMICONDUCTOR DEVICE

BACKGROUND OF THE INVENTION

1. Field of the Invention

The present invention relates to a method for measuring the leakage current in the unction region of a semiconductor device.

2. Description of the Prior Art

In the fabrication of semiconductor devices, it is required to usually monitor leakage current at the P-N junction because such leakage current has a close relationship with the refresh time of cells.

Furthermore, the leakage current at impurity junctions may be greatly influenced by the method of forming element-isolating oxide films. For this reason, the checking about the leakage current should be made where new element isolating methods are used in the fabrication of semiconductor devices.

In accordance with conventional methods, the measurement of leakage current is achieved after carrying out a series of complex processing steps through the well, element-isolating oxide film gate, source/drain region, interlayer insulating film and metal contact. As a result, a lot of time is taken to achieve the measurement of leakage current.

SUMMARY OF THE INVENTION

Therefore, an object of the invention is to provide a method for measuring the leakage current in the junction region of a semiconductor device, capable of achieving a simple and accurate measurement of the leakage current.

In accordance with the present invention, this object is accomplished by providing a method for measuring the leakage current in a semiconductor device, comprising the steps of:

preparing a primary-conduction type silicon substrate;

forming element-isolating oxide films on the primary-conduction type silicon substrate, thereby defining active and field regions in the primary-conduction type silicon substrate;

implanting second-conduction type impurity ions in the active regions of the primary-conduction type silicon substrate, thereby forming impurity diffusion regions;

forming a conductive layer over the resulting structure obtained after the formation of the impurity diffusion regions, and patterning the conductive layer, thereby forming a plurality of dies isolated from one another; and applying a voltage to the impurity diffusion regions via the conductive layer, thereby measuring junction the leakage current.

BRIEF DESCRIPTION OF THE DRAWINGS

Other objects and aspects of the invention will become apparent from the following description of embodiments with reference to the accompany drawings in which.

DETAILED DESCRIPTION OF THE PREFERRED EMBODIMENTS

FIGS. 1A to 1D are sectional views respectively illustrating sequential steps of forming a test pattern used to measure the leakage current in the junction region of a semiconductor device in accordance with the present invention.

Figure 1A:
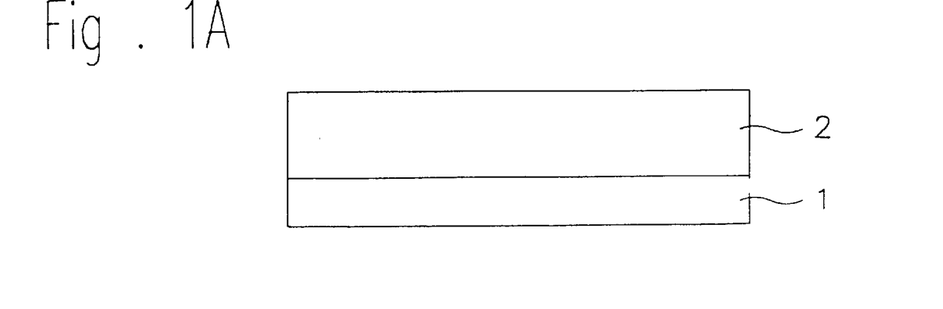
FIGS. 1A to 1D are sectional views respectively illustrating sequential steps of forming a test pattern used to measure the leakage current in the junction region of a semiconductor device in accordance with the present invention.

In accordance with the present invention, boron ions are implanted in a P type silicon substrate 1 which is, in turn, annealed, thereby forming a P type well 2, as shown in FIG. 1A. The implantation of boron ions is carried out using a dose ranging from about $1.0 \times 10^{13}$ to $2 \times 10^{13}$ and energy of about 80 KeV.

Figure 1B:
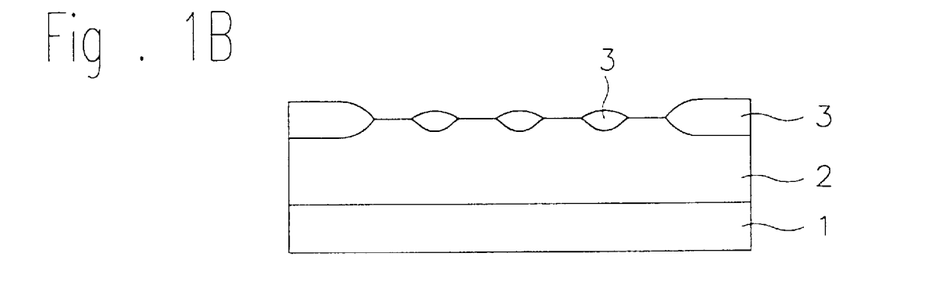

Thereafter, element-isolating oxide films 3 are formed on the P type well 2 in accordance with an etching and annealing process using an element isolation mask, as shown in FIG. 1B. The silicon substrate 1 is defined with active and field regions by the element-isolating oxide films 3.

Figure 1C:
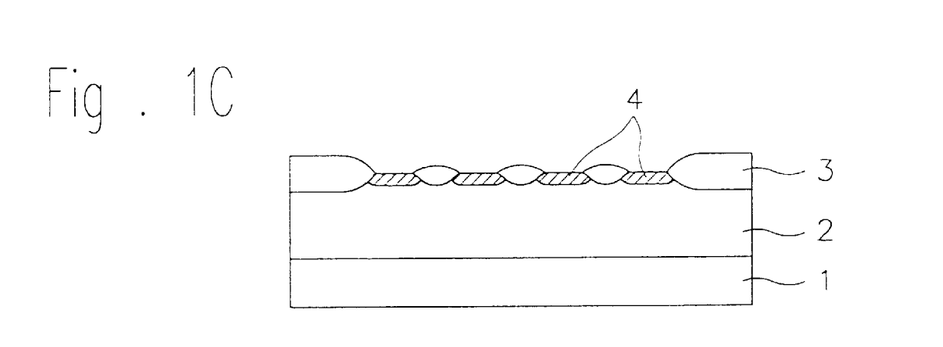

Using the element-isolating oxide films 3 as a mask, n type impurity ions are then implanted in the silicon substrate 1 thereby forming impurity diffusion regions 4 as shown in FIG. 1C.

In this case, an ion implantation for adjusting threshold voltage and a channel stop ion implantation may be carried out prior to the formation of the impurity diffusion regions 4.

Where the silicon substrate 1 has a N type conductivity, p type impurity ions are used to form the impurity diffusion regions 4.

Figure 1D:
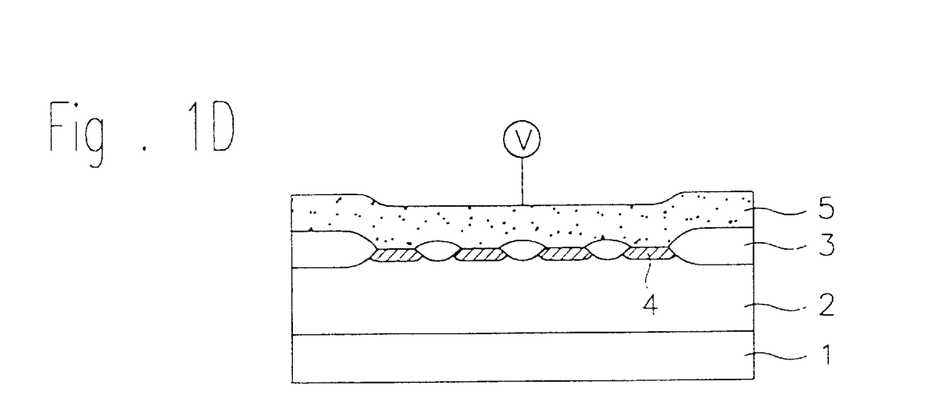

Subsequently, removal of an oxide film (not shown) naturally formed on the silicon substrate 1 is carried out using HF. A doped polysilicon layer 5 is then formed over the entire exposed upper surface of the resulting structure including the exposed upper surface of the silicon substrate 1 and the exposed upper surfaces of the element-isolating oxide films 3, as shown in FIG. 1D. The doped polysilicon layer 5 is used as an electrode.

The doped polysilicon layer 5 is then patterned to form a plurality of test patterns (not shown) for unit dies each having a N type active region capacity ranging from about 1M to about 4M.

Where the silicon substrate 1 has the N type conductivity, test patterns for applying reverse voltage to the junction may be formed by forming an N type well and forming P type impurity diffusion regions.

Thus, the silicon substrate 1 has a P-N junction structure along with the element-isolating oxide films 3. Thereafter, reverse voltage is applied to the P-N junction to measure the leakage current at the junction. The application of the reverse voltage is achieved by applying ground voltage to the silicon substrate 1 while applying plus voltage to the impurity diffusion regions 4 via the polysilicon layer 5.

It is possible to reduce the number of poor dies using the test patterns according to the present invention. This will be described hereinafter.

Figure 2A:
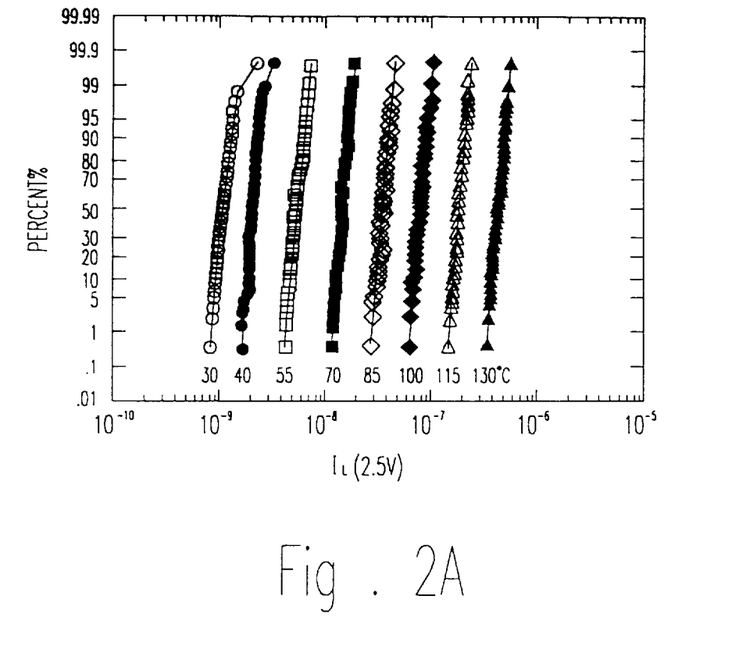
FIGS. 2A to 2C are graphs respectively depicting a variation in the leakage current characteristic depending on a variation in temperature when reverse voltages with different voltage levels are applied to a plurality of dies using test patterns in accordance with a first embodiment of the present invention.
Figure 2B:
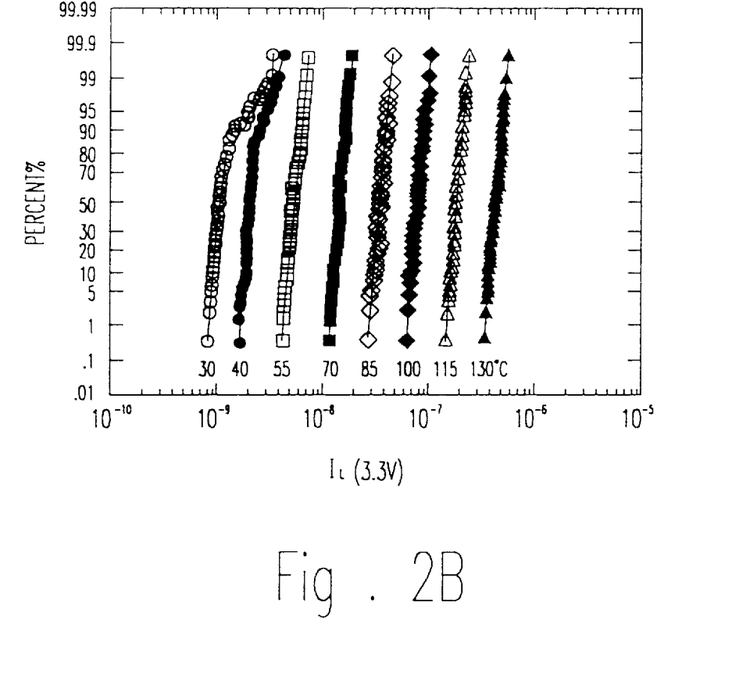
Figure 2C:
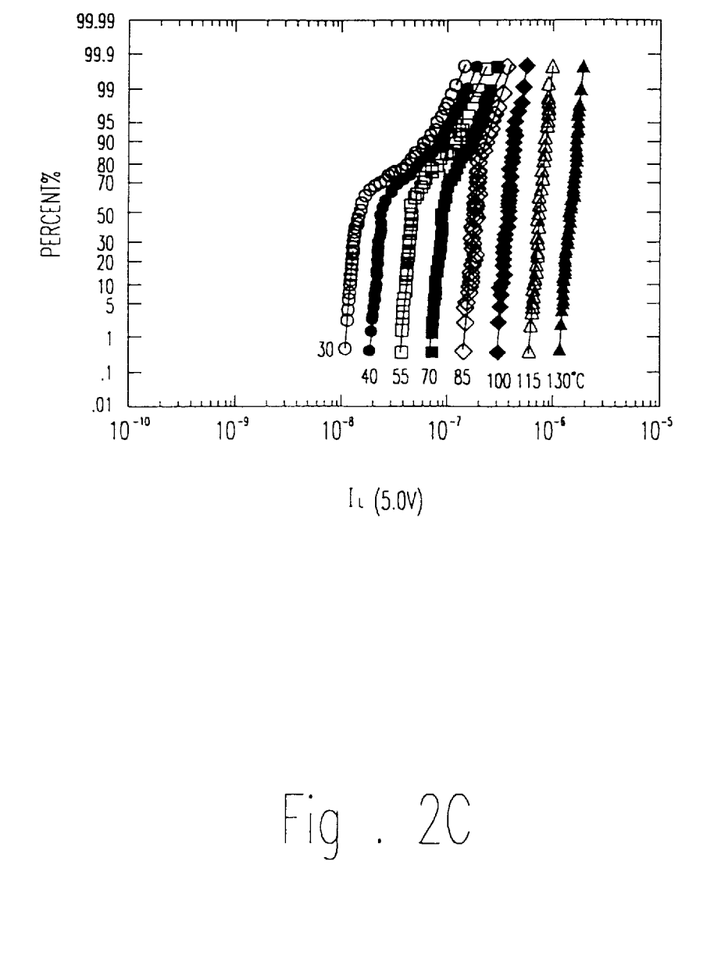

FIGS. 2A to 2C are graphs respectively depicting a variation in the leakage current characteristic depending on a variation in temperature when reverse voltages with different voltage levels are applied to a plurality of dies using test patterns in accordance with a first embodiment of the present invention.

For the testing of FIGS. 2A to 2C, about 140 dies each having a capacity of about 3.5M were prepared as mentioned above. Reverse voltages of about 2.5V, 3.3V and 5.0V were applied to the prepared dies using the test patterns shown in FIG. 1D while varying temperature in order to measure the amount of the leakage current generating due to the application of voltage. The amounts of the leakage current respectively generated in all dies at each temperature and each voltage were accumulated. The accumulated results respectively associated with reverse voltages of 2.5V, 3.3V and 5.0V are depicted by FIGS. 2A to 2C.

Referring to FIGS. 2A to 2C, it can be found that there is no poor die at a low measuring voltage, namely, 2.5V whereas about 30% of 140 dies exhibit a poor characteristic at a temperature range between about 30° C. and about 80° C. when the measuring voltage increases to about 5.0V. The reason why there is no poor die at about 2.5V is because the depletion region of the P-N junction associated with about 2.5V does not have defects resulting in the formation of poor dies. However, such defects exist in the depletion region associated with about 5.0V, thereby adversely affecting the the leakage current characteristic of the P-N junction.

Figure 3A:
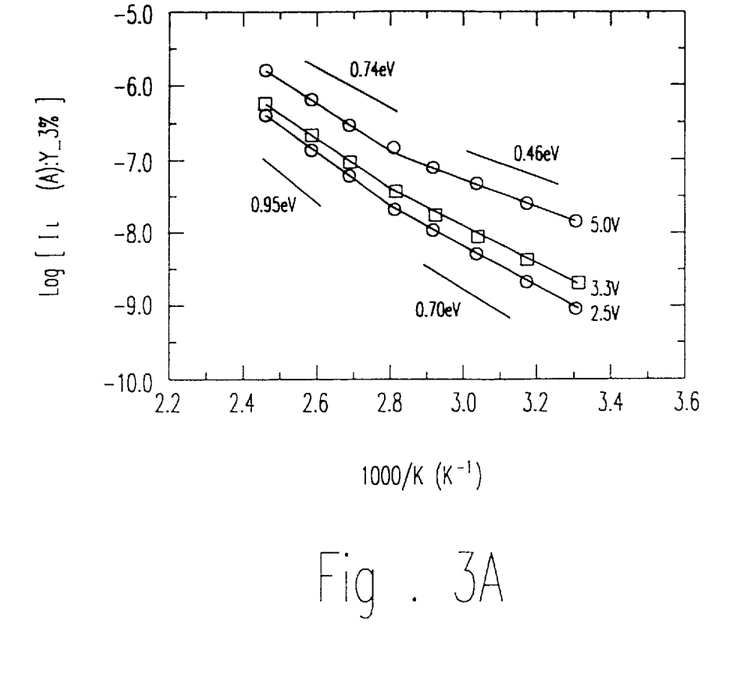
FIGS. 3A to 3C are graphs respectively depicting the leakage current characteristics of dies with different yttrium contents using test patterns in accordance with a second embodiment of the present invention.
Figure 3B:
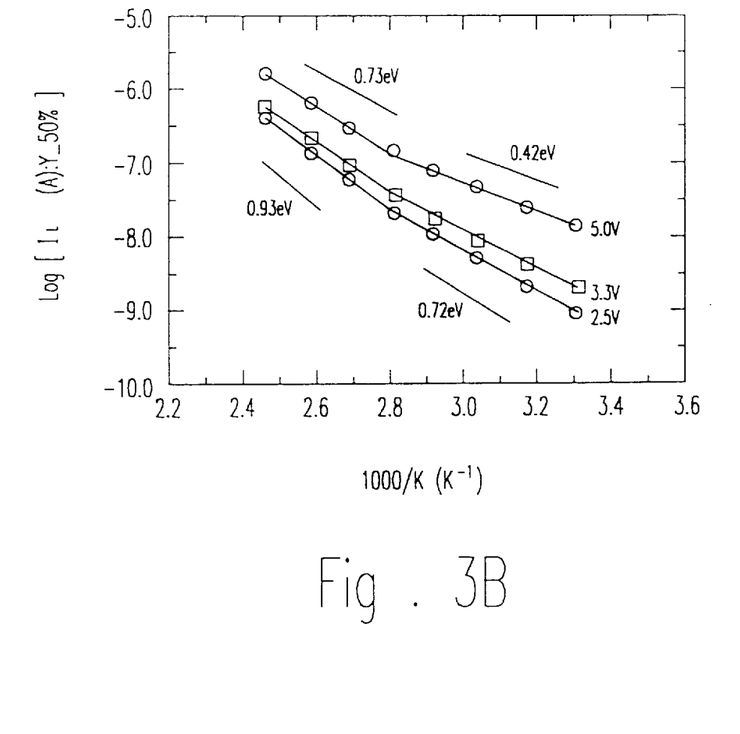
Figure 3C:
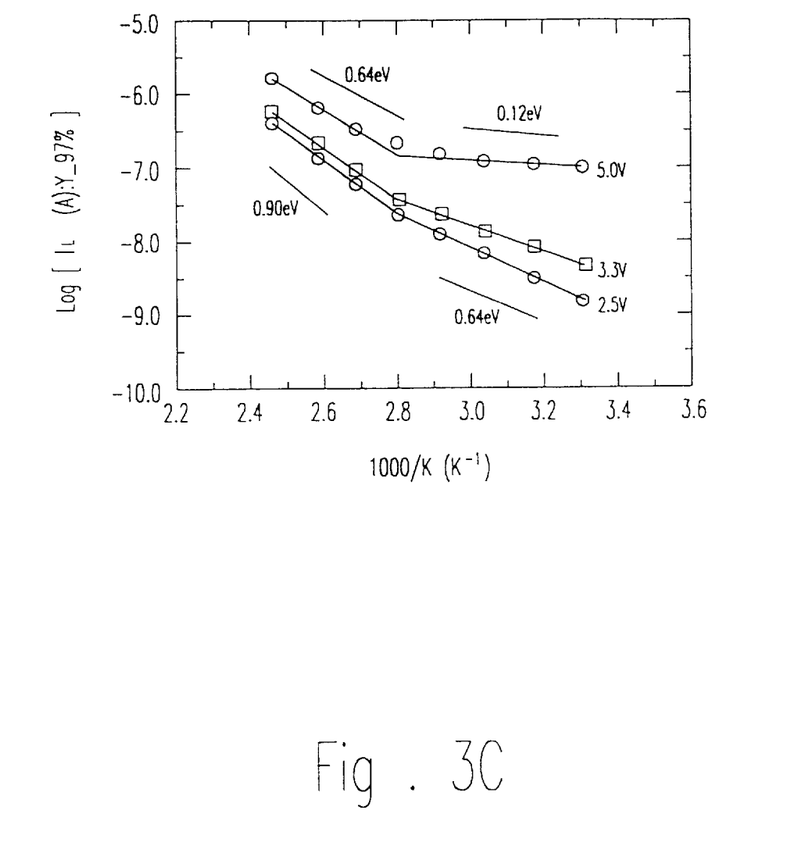

FIGS. 3A to 3C are graphs respectively depicting the leakage current characteristics of dies with different yttrium contents using test patterns in accordance with a second embodiment of the present invention. In other words, FIGS. 3A to 3C are Arrhenius plots respectively depicting log [$I_L$]:1000/K using data depicted in FIGS. 2A to 2C to check the kind of defects. Here, $I_L$ represents the leakage current.

In the cases of Y-3% and Y-50% dies exhibiting a good the leakage current characteristic, high activating energy is exhibited even in a low temperature depletion region, as shown in FIGS. 3A and 3B. In the case of Y-97% dies exhibiting a poor the leakage current characteristic, however, low activating energy of about 0.12 eV is exhibited in a low temperature depletion region associated with about 5.0V.

By referring to FIGS. 3A to 3C, it is understood that the defects resulting in the generation of the leakage current are stacking faults occurring when an element of the isolation process is carried out. Therefore, it is possible to prevent a degradation in the operated characteristic resulting from the the leakage current by eliminating stacking faults existing in the depletion region.

Figure 4A:
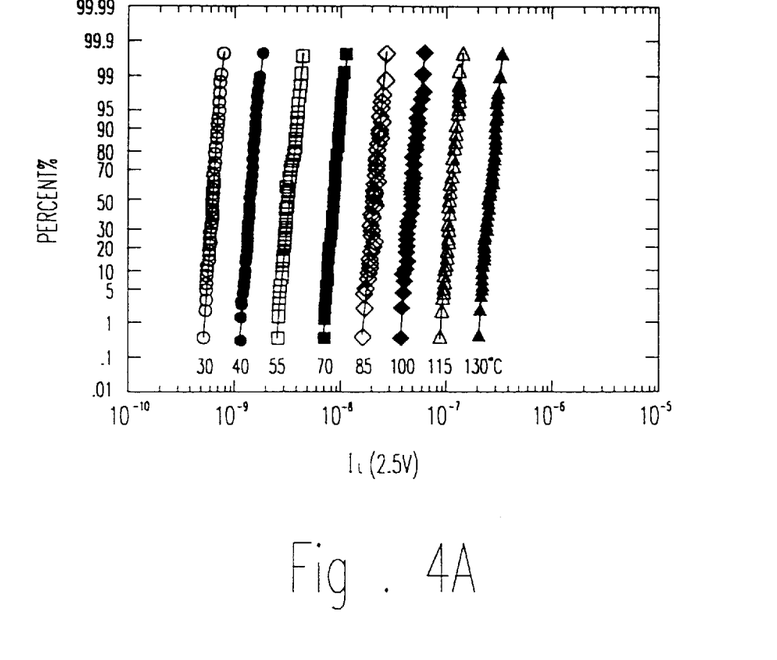
FIGS. 4A to 4C are graphs respectively depicting a variation in the leakage current characteristic depending on a variation in temperature when reverse voltages with different voltage levels are applied-to a plurality of dies using test patterns in accordance with a third embodiment of the present invention.
Figure 4B:
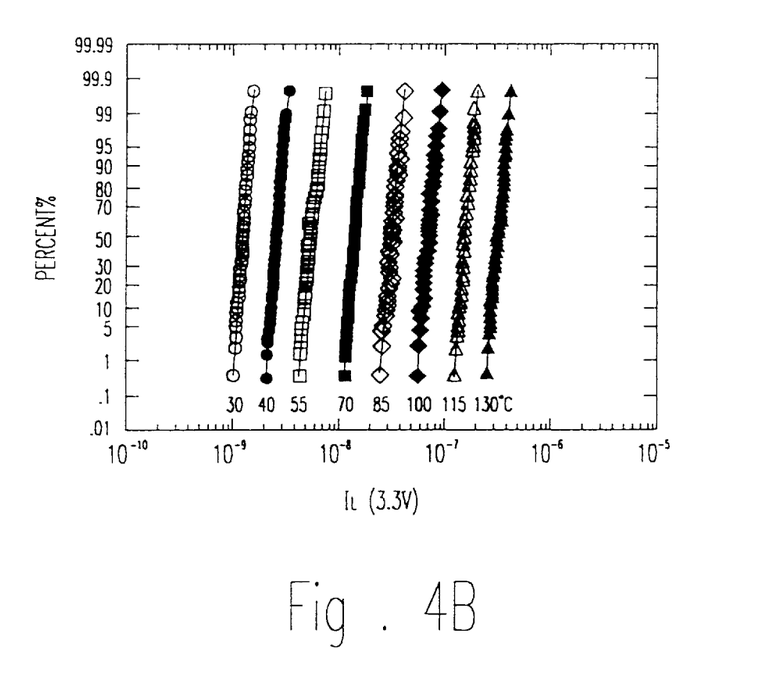
Figure 4C:
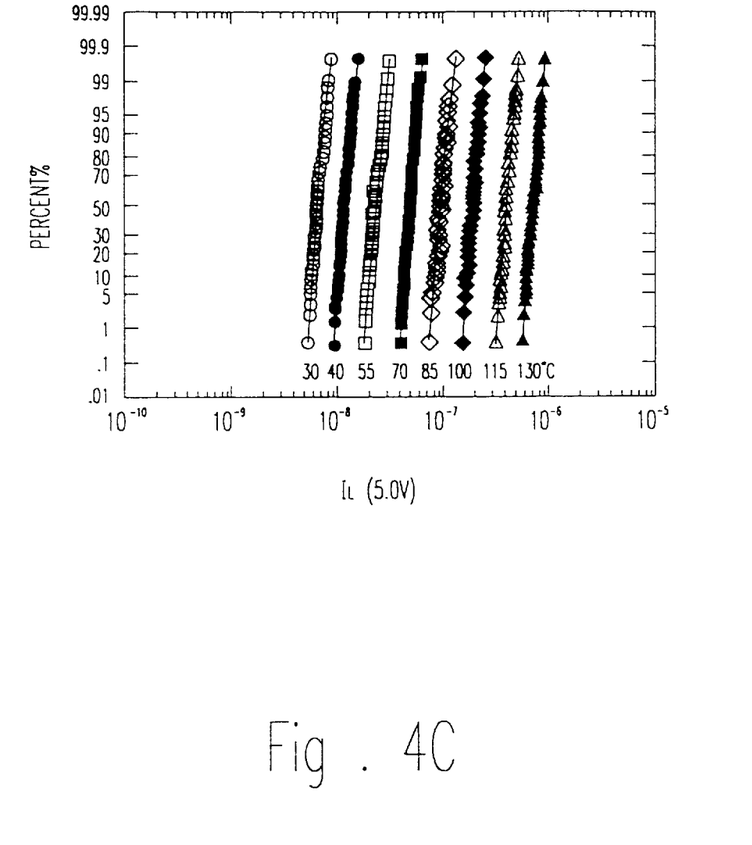

FIGS. 4A to 4C are graphs respectively depicting a variation in the leakage current depending on a variation in temperature when reverse voltages with different voltage levels are applied to a plurality of dies using test patterns in accordance with a third embodiment of the present invention. In accordance with this embodiment, the dies are processed at the element isolation step in such a fashion that no stacking fault occurs. In addition, the measurement of the leakage current was carried out in the same manner as the first embodiment.

Referring to FIGS. 4A to 4C, there is no poor die.

Figure 5A:
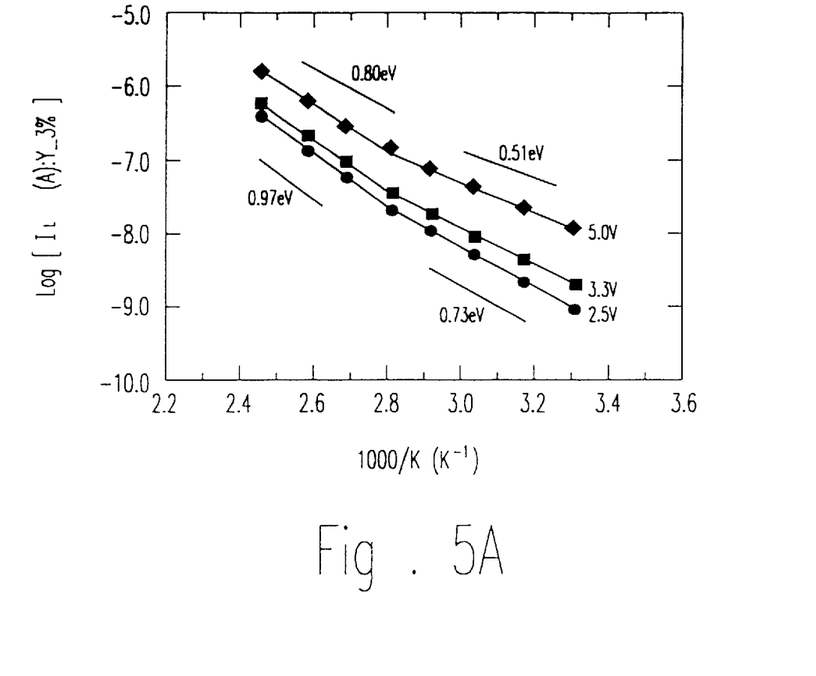
FIGS. 5A to 5C are graphs respectively depicting the leakage current characteristics of dies with different yttrium contents using test patterns in accordance with a fourth embodiment of the present invention.
Figure 5B:
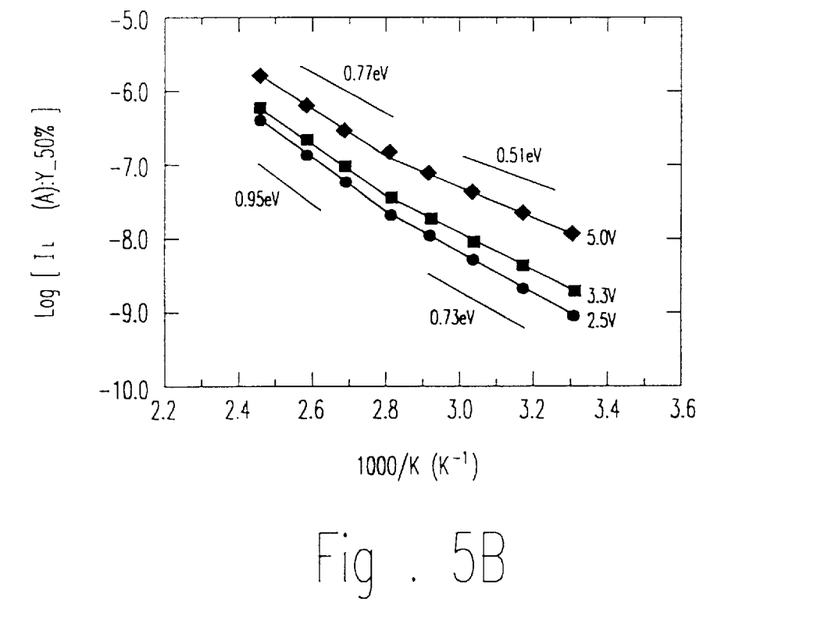
Figure 5C:
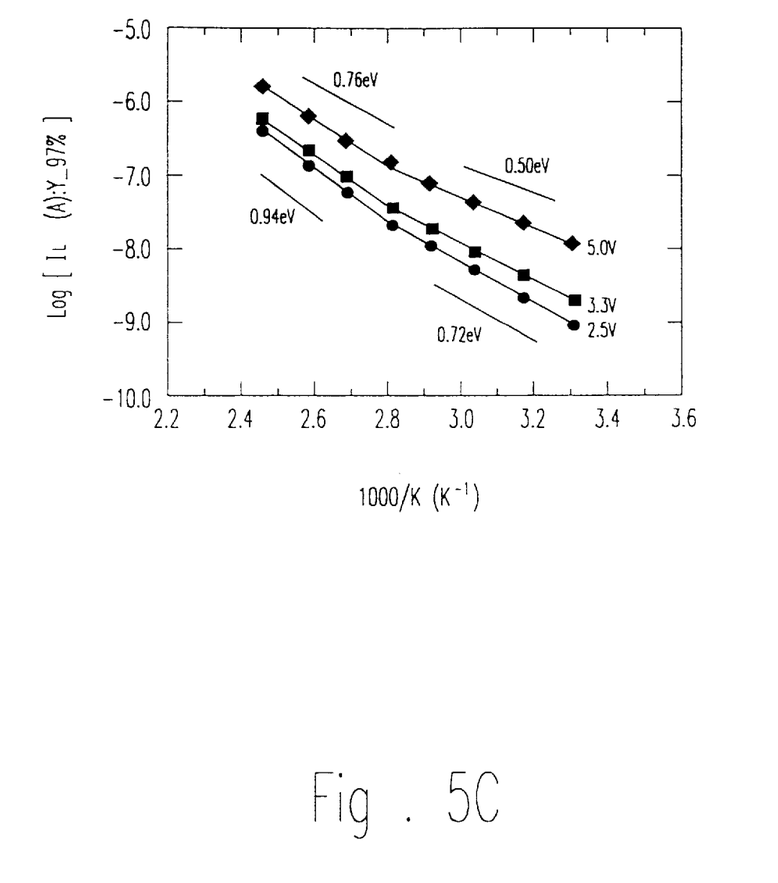

On the other hand, FIGS. 5A to 5C are graphs respectively depicting the leakage current characteristics of dies with different yttrium contents using test patterns in accordance with a fourth embodiment of the present invention. In other words, FIGS. 5A to 5C are Arrhenius plots respectively depicting log [$I_L$]:1000/K using data depicted in FIGS. 4A to 4C to check the kind of defects. Here, $I_L$ represents the leakage current. Referring to FIGS. 5A to 5C, it can be found that even in the case of Y-97% dies exhibiting a poor the leakage current characteristic, a high activation energy of about 0.50 eV or above is exhibited.

As apparent from the above description, the present invention provides a method for measuring the leakage current in the junction region of a semiconductor device, capable of achieving a simple and accurate measurement of the leakage current by use of a simple processing step carried out after the formation of element-isolating oxide films. Accordingly, it is possible to rapidly check the characteristic of the element isolation process involved in the fabrication of semiconductor devices. The checked characteristic of the element isolation process is then fed back. Accordingly, the production yield of semiconductor devices may increase.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for measuring a junction leakage current in a semiconductor device, the method comprising:

providing a first-conduction-type silicon substrate;

forming a first-conduction-type well in the substrate;

forming element-isolating oxide films on the well;

implanting second-conduction-type impurity ions in the regions between the oxide films to form impurity diffusion regions;

forming a conductive layer for an electrode over said oxide films and diffusion regions;

patterning the conductive layer to define plural dies that each have plural cells that each include the impurity diffusion regions and the conductive layer; and applying a reverse voltage to the impurity diffusion regions and the substrate so as to measure the junction leakage current.

2. The method of claim 1, wherein the conductive layer includes:

an in-situ doped polysilicon or a $POCl_3$ doped polysilicon layer.

3. The method of claim 1, wherein the reverse voltage is obtained by:

applying a ground voltage to the substrate; and applying a positive voltage to the conductive layer.

4. The method of claim 1, wherein:

the patterning step is carried out so that each die has an active capacity ranging from about 1M to about 4M.

5. The method of claim 4, wherein:

the number of dies is about 100 to 200.

6. The method of claim 1, further comprising:

applying a reverse voltage of about 2.5 to 5.0 volts to the plural dies at a temperature ranging from about 30° C.

to about 130° C., to measure the junction leakage current of the respective dies; and depicting the junction leakage current of the respective dies by cumulative graphs.

7. The method of claim 6, further comprising:

examining the cumulative graph to find poor dies;

depicting Arrhenius plots for the poor dies by plotting log (junction leakage current) as a function of 1000/k; and using the Arrhenius plots to detect defects resulting in the poor dies.

8. The method of claim 7, wherein:

the defects include a stacking fault that occurs in an element isolation process.

9. A method for measuring leakage current in a semiconductor device, the method comprising:

providing a P-type silicon substrate;

forming a P-type well in the substrate;

forming element-isolating oxide films on the well;

implanting N-type impurity ions in the said oxide films and diffusion regions to form impurity diffusion regions;

forming a conductive layer for an electrode over said oxide films and diffusion regions;

patterning the conductive layer to define plural dies that each have plural cells that each include the impurity diffusion regions and the conductive layer; and applying a reverse voltage to the impurity diffusion regions and the substrate so as to measure the junction leakage current.

10. The method of claim 9, wherein the conductive layer includes:

an in-situ doped polysilicon or a $POCl_3$ doped polysilicon layer.

11. The method of claim 9, wherein the reverse voltage is obtained by:

applying a ground voltage to the substrate; and applying a positive voltage to the conductive layer.

12. The method of claim 9, wherein:

the patterning step is carried out so that each die has an active capacity ranging from about 1M to about 4M.

13. The method of claim 12, wherein:

the number of dies is about 100 to 200.

14. The method of claim 9, further comprising:

applying a reverse voltage of about 2.5 to 5.0 volts to the plural dies at a temperature ranging from about 30° C. to about 130° C., to measure the junction leakage current of the respective dies; and depicting the junction leakage current of the respective dies by cumulative graphs.

15. The method of claim 14, further comprising:

examining the cumulative graphs to find poor dies;

depicting Arrhenius plots for the poor dies according by plotting log (junction leakage current) as a function of 1000/k; and using the Arrhenius plots to detect defects resulting in the poor dies.

16. The method of claim 15, wherein:

the defects include a stacking fault that occurs in an element isolation process.

* * * * *